United States Patent
Wirz et al.

(10) Patent No.: US 11,004,828 B2
(45) Date of Patent: May 11, 2021

(54) METHODS AND APPARATUS FOR INTEGRATED GANG BONDING AND ENCAPSULATION OF STACKED MICROELECTRONIC DEVICES

(71) Applicant: Micron Technology, Inc., Boise, ID (US)

(72) Inventors: Brandon P. Wirz, Boise, ID (US); Bradley R. Bitz, Boise, ID (US); Pei Sian Shao, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,504

(22) Filed: Aug. 28, 2019

(65) Prior Publication Data

US 2021/0066246 A1  Mar. 4, 2021

(51) Int. Cl.
*H01L 21/00* (2006.01)
*H01L 25/065* (2006.01)
(Continued)

(52) U.S. Cl.
CPC .......... *H01L 25/0657* (2013.01); *B29C 43/18* (2013.01); *B29C 43/36* (2013.01); *H01L 21/565* (2013.01); *H01L 21/568* (2013.01); *H01L 25/50* (2013.01); *B29C 2043/181* (2013.01); *B29K 2063/00* (2013.01); *B29L 2031/3481* (2013.01); *H01L 2225/06513* (2013.01); *H01L 2225/06582* (2013.01)

(58) Field of Classification Search
CPC ... H01L 25/50; H01L 25/0657; H01L 25/105; H01L 25/15; H01L 25/03; H01L 2225/06513; H01L 2225/06582; H01L 21/565; H01L 21/568; H01L 21/78; H01L 21/2007; H01L 21/563; H01L 21/566; B29C 43/18; B29C 43/36; B29C 43/203; B29C 43/021; B29C 43/00; B29C 43/56; B29C 2043/181; B29K 2063/00; B29L 2031/3481

See application file for complete search history.

(56) References Cited

U.S. PATENT DOCUMENTS

| 4,680,617 A | * | 7/1987 | Ross | ...................... B29C 43/18 |
| | | | | 174/530 |
| 6,507,115 B1 | * | 1/2003 | Hofstee | ............... H01L 23/3677 |
| | | | | 257/685 |

(Continued)

OTHER PUBLICATIONS

Asahi et al., "Multi-chip gang bonding technology using the thermocompression bonder for Si substrate", 2018, ICEP—IAAC 2018 Proceedings, pp. 496-499, Dec. 2018. (Year: 2018).*

(Continued)

*Primary Examiner* — Nikolay K Yushin
(74) *Attorney, Agent, or Firm* — TraskBritt

(57) ABSTRACT

Methods for fabricating microelectronic device assemblies, the method comprising providing mutually spaced stacks of microelectronic devices on a substrate and substantially concurrently encapsulating the stacks of microelectronic devices on the substrate and gang bonding mutually aligned conductive elements of vertically adjacent microelectronic devices. Compression molding apparatus for implementing the methods, and resulting microelectronic device assemblies are also disclosed.

29 Claims, 7 Drawing Sheets

(51) Int. Cl.
    *H01L 21/56*    (2006.01)
    *H01L 25/00*    (2006.01)
    *B29C 43/18*    (2006.01)
    *B29C 43/36*    (2006.01)
    B29L 31/34     (2006.01)
    B29K 63/00     (2006.01)

(56)　　　　　References Cited

U.S. PATENT DOCUMENTS

| | | | |
|---|---|---|---|
| 8,138,014 B2* | 3/2012 | Chi | H01L 25/0657 |
| | | | 438/106 |
| 9,508,665 B2 | 11/2016 | Beyne et al. | |
| 9,536,862 B2 | 1/2017 | Shen et al. | |
| 9,735,131 B2* | 8/2017 | Su | H01L 25/0657 |
| 9,773,724 B2 | 9/2017 | Chen et al. | |
| 9,780,065 B2 | 10/2017 | Chylak et al. | |
| 10,046,494 B2* | 8/2018 | Pruitt | B29C 45/20 |
| 2002/0074668 A1* | 6/2002 | Hofstee | H01L 25/0657 |
| | | | 257/777 |
| 2011/0186977 A1* | 8/2011 | Chi | H01L 24/97 |
| | | | 257/686 |
| 2017/0133351 A1* | 5/2017 | Su | H01L 25/105 |
| 2018/0065286 A1* | 3/2018 | Pruitt | B29C 45/2725 |

OTHER PUBLICATIONS

Fan et al., Low Temperature Wafer-Level Metal Thermo-Compression Bonding Technology for 3D Integration, Metallurgy—Advances in Materials and Processes, (2012), pp. 71-94.

LeCarpentier et al., Die-to-Wafer Bonding of Thin Dies Using a 2-Step Approach; High Accuracy Placement, then Gang Bonding, 6th Int'l Conference & Exhibit on Device Packaging, (Jan. 2010), 33 pages.

Okoro et al., Insertion Bonding: A Novel Cu—Cu Bonding Approach for 3D Integration, 2010 Electronic Components and Technology Conference, (2010), pp. 1370-1375.

* cited by examiner

METHODS AND APPARATUS FOR INTEGRATED GANG BONDING AND ENCAPSULATION OF STACKED MICROELECTRONIC DEVICES

TECHNICAL FIELD

Embodiments disclosed herein relate to fabrication of encapsulated assemblies of stacked microelectronic devices. More particularly, embodiments disclosed herein relate to methods and apparatus for integrated (e.g., substantially concurrent) gang bonding and encapsulation with a molding compound of stacked microelectronic devices (e.g., semiconductor dice).

BACKGROUND

As the electronics industry has moved toward three-dimensional assemblies of stacked microelectronic devices, most commonly in the form of stacked semiconductor dice, the time and cost incurred in mechanically and electrically connecting aligned conductive elements of the stacked dice prior to encapsulating the die stacks has become an issue. Conventionally, singulated semiconductor dice, wherein all but the top die of a die stack to be formed comprise through substrate vias (TSVs, also termed "through silicon vias") terminating at opposing surfaces of each die at conductive elements in the form of pillars and pads, are stacked with pillars of a die aligned with pads of an adjacent die. Each die stack is formed on and aligned with conductive elements of a die location of an unsingulated base wafer, other bulk semiconductor substrate, or other component. The pillars may comprise a single conductive material, such as copper, or a conductive material capped by solder.

Thermocompression bonding techniques, wherein heat and pressure (i.e., vertical force) are applied to cause conductive elements of a semiconductor die to bond to conductive elements of another semiconductor die or base substrate, have proven to provide robust mechanical and electrical connections between the components. However, thermocompression bonding, as conventionally practiced, is costly and time-consuming when multiple, stacked semiconductor dice are to be bonded, an ever-more common requirement as three-dimensional (3D) assemblies of semiconductor dice using smaller conductive elements at reduced pitches are implemented on a commercial scale. For example, stacks of memory dice comprising four, eight, twelve or even sixteen semiconductor dice, such as may be implemented in a Hybrid Memory Cube architecture, as well as such stacks including a logic die in the case of high bandwidth memory (HBM) architectures, may be fabricated.

For example, when multiple semiconductor dice are to be stacked on die locations of a bulk semiconductor substrate (e.g., wafer), as the stack is formed, the singulated dice of a given level are placed and then thermocompression gang bonded one by one to the base wafer or to a lower level of dice by application of heat and pressure, and the process is repeated, die-level by die-level, until a die stack of desired number (e.g., four dice, eight dice, etc.) is achieved. Even when such stacking and gang bonding is performed at the wafer level, it will be appreciated that such an approach is cost- and time-intensive, requiring multiple acts of stacking and individually gang bonding of dice of each die level using a pick and place apparatus before proceeding to form the next, higher level. In addition, conventional thermocompression bonding of copper-to-copper conductive elements is a solid state diffusion bonding process resulting in interdiffusion of atoms and grain growth between two abutting metal surface carried out at undesirably high temperatures, on the order of about 300° C. even for so-called "low temperature" bonding. Such temperatures are well in excess of temperature tolerances of dielectric molding compounds conventionally employed to encapsulate the die stacks, requiring complete bonding of all die stacks before encapsulation. Avoidance of the higher temperatures associated with thermocompression bonding is also desirable due to thermal budget limitations of the dice, as well as post-bonding thermos-mechanical stress control, and alignment accuracy constraints.

DETAILED DESCRIPTION

Figure 1A:
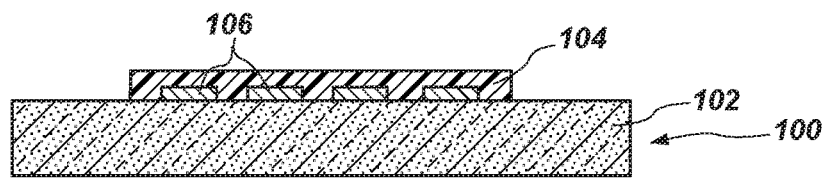
FIGS. 1A through 1E schematically depict a sequence of acts in a bonding process to initially mechanically and electrically connect a stack of semiconductor dice prior to initiation of permanent connections.

The following description, taken in conjunction with the various drawing figures, relates to embodiments wherein integrated (e.g., substantially concurrent) gang bonding of conductive elements of a stack of microelectronic devices (e.g., semiconductor dice, wafer, other substrate) with encapsulation of at least some components of the assembly with a dielectric molding compound at sufficiently low temperatures so as to not adversely affect the encapsulation material or electrical components of the assembly.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing an encapsulated assembly of stacked microelectronic devices. Only those process acts and apparatus necessary to understand the embodiments of the disclosure are described in detail below. Additional process acts and apparatus for fabricating a complete encapsulated assembly of stacked microelectronic devices in the form of a semiconductor device package may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "microelectronic device," "semiconductor die" and "semiconductor dice" are to be broadly construed, and to include devices and dice not limited to the use of semiconductor materials or electrical circuits for functioning, unless the specific context of usage of the respective term is so limiting. For example, and without limitation, magnetic memory, phase change memory, optical devices and MEMS devices may be so characterized.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral" and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," "adjacent" and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly. In addition, a material, feature or element may be "over," "under," "adjacent," etc., another material, feature or element without being in direct contact with the other material unless so specified.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. In some embodiments, the substrate may comprise a printed circuit board, or an interposer.

As used herein with reference to connection of two conductive elements of one or more metal materials (e.g., metals, metal alloys), the term "bond" means and includes a robust metallurgical bond. Such an interconnect bond may be utilized, in various applications, for one or more of electrical communication, thermal transfer or mechanical support. Such a bond may be used to provide sufficient electrical and/or thermal conductivity and mechanical strength as well as sufficiently low resistance for operation of electrical (e.g., microelectronic) devices connected by such bonds. As used herein, the term "gang bonding" means and includes a single bonding act effected to bond multiple aligned conductive elements of two or more microelectronic devices to one another. Gang bonding may be effected, for example, to bond conductive elements of two or more vertically stacked microelectronic devices (e.g., semiconductor dice) to one another, as well as to conductive elements of a supporting substrate, as well as substantially concurrently mutually bonding aligned conductive elements of devices in multiple stacks and to conductive elements of a supporting substrate.

A bond as that term is used herein is to be distinguished from a "tack," which may be formed to join two aligned, mutually contacting conductive elements initially using (for example) heat and applied force to provide a metallurgical face bond at a contact interface between facing surfaces of aligned conductive elements. As another example, ultrasonic energy may be applied to implement a tack between conductive elements. A tack may be employed to fix relative locations of contacting conductive elements and thus of the microelectronic devices bearing such conductive elements prior to bonding of the conductive elements. In other words, a tack may be considered as a temporary securement between conductive elements of a microelectronic device assembly of sufficient strength to maintain connections between such conductive elements during handling and movement, but insufficient for a permanent physical securement and mechanical support between the conductive elements, for reliable electrical signal communication (i.e., data, power, bias (e.g., ground) purposes, or for efficient heat transfer.

In the description which follows, like components and features in various drawing figures are identified with the same or similar reference numerals and other indicia, for the sake of clarity and convenience.

FIGS. 1A through 1E schematically depict a method for fabricating stacks of bonded semiconductor dice on a substrate, such as a semiconductor wafer or other bulk substrate comprising unsingulated semiconductor die locations and initially (e.g., temporarily) mutually bonding conductive elements of components of the stack.

FIG. 1A depicts a single, semiconductor die location 102 of a substrate 100 onto which a wafer level underfill (WLUF) or a non-conductive film (NCF) 104 has been applied and laminated. The WLUF or NCF 104 adheres to substrate 100 but does not interfere with thermocompression bonding of conductive elements 202 (e.g., pillars, solder pillar caps, solder) of a semiconductor die 200 to be flip-chip attached to conductive pads 106 of semiconductor die location 102 (see FIG. 1B).

Figure 1B:
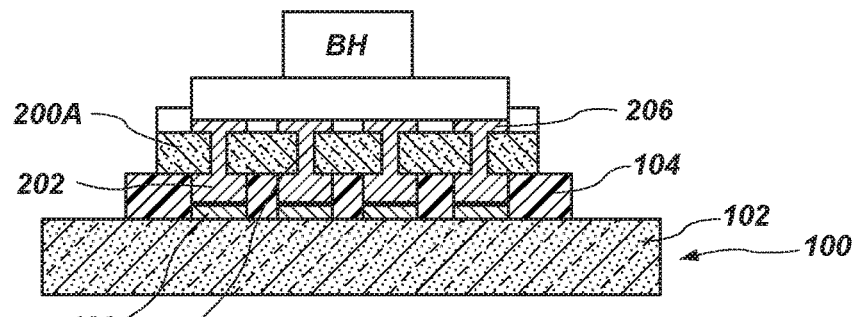

FIG. 1B depicts a semiconductor die 200A inverted over semiconductor die location 102 in a flip-chip orientation with conductive elements 202 in the form of pillars contacting aligned conductive elements in the form of pads 106 of semiconductor die location 102. Semiconductor die 200A is configured with so-called "through silicon vias" (TSVs) 204 comprising conductive paths electrically isolated from surrounding semiconductor material and extending vertically between conductive elements 202 and conductive pads 206 on the opposing (upper) side of semiconductor die 200A. Semiconductor die 200A is initially secured to substrate 100 by "tacking," wherein heat and downward vertical force are applied for a brief period through a bond head BH used to pick and place singulated semiconductor die 200A and to then "tack" (i.e., initially metallurgically face bond) conductive elements 202 of semiconductor die 200A to pads 106 of semiconductor die location 102. By way of example only, bond head BH may apply heat to heat semiconductor die 200A at a temperature of between about 100° C. and about 150° C. (e.g., between about 120° C. and about 140° C.) for a brief period, for example of about 0.3 seconds to about 1.5 seconds in what may be termed a "quick tack" process. At the same time semiconductor die 200A is heated, downward force is applied to the die by bond head BH, which may be in the range of about 10N to about 150N. Such force may vary significantly with the number, and thus the surface area of the interconnects (i.e., surface area of contacting surfaces of aligned conductive elements) to be tacked, as well as the size of the semiconductor die. For example, for a semiconductor die having only a few hundred interconnects, a force of no more than about 15N may be sufficient to tack the interconnects. On the other hand, a semiconductor die having ten thousand interconnects may be subjected to a force of about 110N to tack the interconnects. The materials of the interconnects may have an impact on the force needed. The foregoing heat and force ranges may be employed, for example in tacking interconnects (described in detail below) comprising Cu and/or Ni capped with Sn solder for a pillar and Cu and/or Ni plated with Au for a conductive pad. In may be substituted for Sn on the pillar. Cu to Cu interconnects configured for insertion bonding may also be tacked using heat and force within the foregoing ranges, as may solder interconnects comprising Sn or In conductive elements. Another method for mutually tacking conductive elements using ultrasonic energy for implementing tack bonds may be found in U.S. Pat. No. 9,780,065, assigned to Kulick and Soffa Industries, Inc.

Figure 1C:
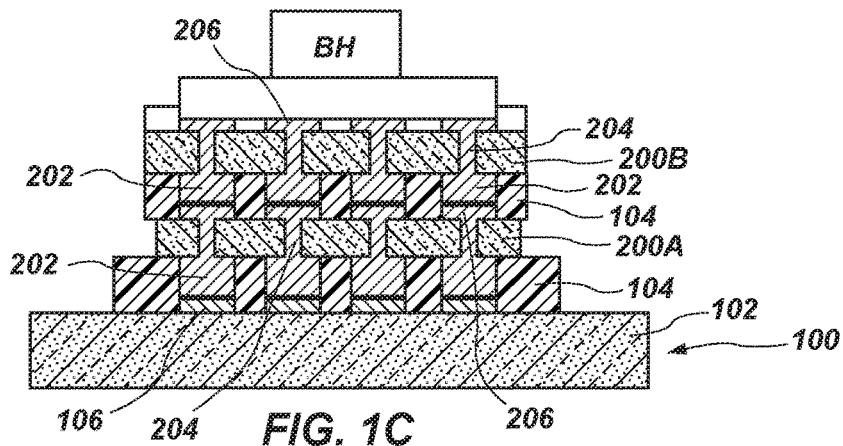

FIG. 1C depicts a semiconductor die 200B inverted over semiconductor die 200A in a flip-chip orientation with conductive elements 202 in the form of pillars contacting aligned conductive elements 206 in the form of pads on the upper surface of semiconductor die 200A. Semiconductor die 200B, like semiconductor die 200A, is configured with so-called "through silicon vias" (TSVs) 204 comprising conductive paths electrically isolated from surrounding semiconductor material and extending vertically between conductive elements 202 and conductive pads 206 on the opposing (upper) side of semiconductor die 200A. Semiconductor die 200B is secured to semiconductor die 200A using one of the aforementioned tacking techniques, wherein a bond head BH is used to pick and place singulated semiconductor die 200B and to then "tack" (i.e., initially metallurgically face bond) conductive elements 202 of semiconductor die 200B to conductive pads 206 of semiconductor die 200A. WLUF or NCF 104 is laminated over semiconductor die 200A prior to placement and tacking of semiconductor die 200B.

Figure 1D:
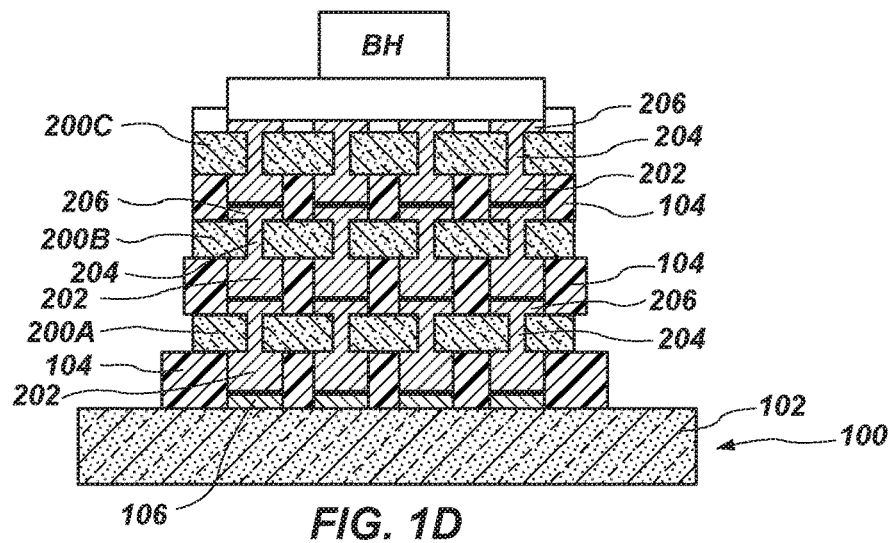

FIG. 1D depicts a semiconductor die 200C inverted over semiconductor die 200B in a flip-chip orientation with conductive elements 202 in the form of pillars contacting conductive elements 206 in the form of pads on the upper surface of semiconductor die 200B. Semiconductor die 200C, like semiconductor dice 200A and 200B, is configured with so-called "through silicon vias" (TSVs) 204 comprising conductive paths electrically isolated from surrounding semiconductor material and extending vertically between conductive elements 202 and conductive pads 206 on the opposing (upper) side of semiconductor die 200B. Semiconductor die 200C is secured to semiconductor die 200B using one of the aforementioned tacking techniques, wherein a bond head BH is used to pick and place singulated semiconductor die 200C and to then "tack" (i.e., initially metallurgically face bond) conductive elements 202 of semiconductor die 200C to conductive pads 206 of semiconductor die 200B. WLUF or NCF 104 is laminated over semiconductor die 200B prior to placement and tacking of semiconductor die 200C.

Figure 1E:
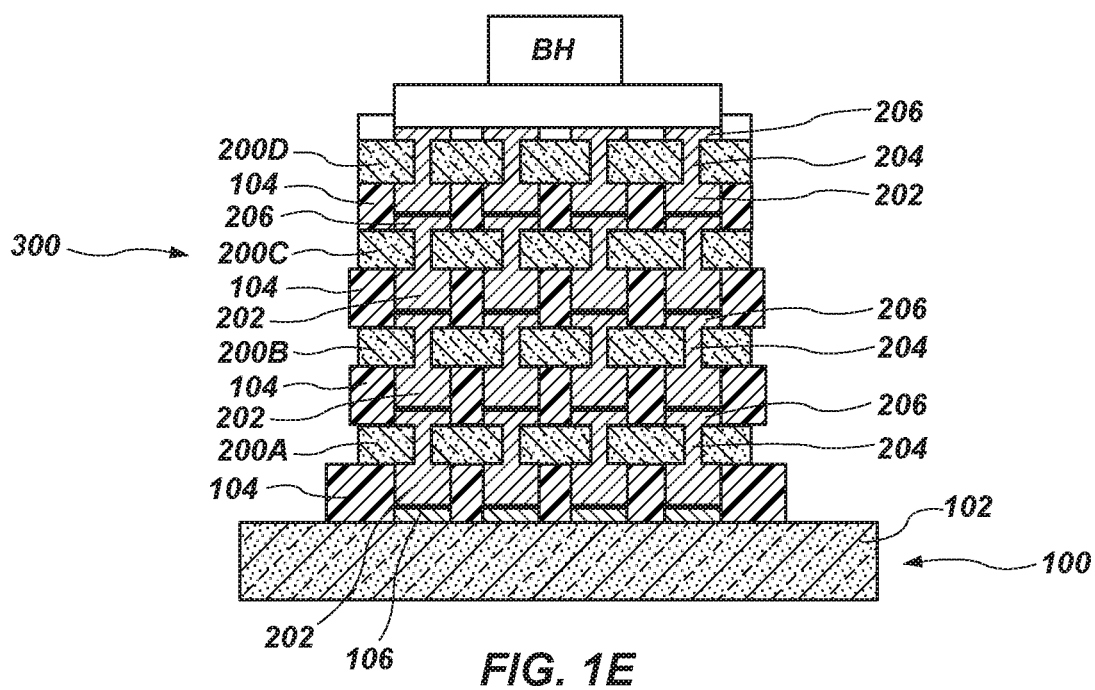

FIG. 1E depicts a semiconductor die 200D inverted over semiconductor die 200C in a flip-chip orientation with conductive elements 202 in the form of pillars contacting conductive elements 206 in the form of pads on the upper surface of semiconductor die 200C. Semiconductor die 200D is secured to semiconductor die 200C using one of the aforementioned tacking techniques, wherein a bond head BH is used to pick and place singulated semiconductor die 200D and to then "tack" (i.e., initially metallurgically face bond) conductive elements 202 of semiconductor die 200D to conductive pads 206 of semiconductor die 200C, forming die stack 300. WLUF or NCF 104 is laminated over semiconductor die 200C prior to placement and tacking of semiconductor die 200D. In the illustrated embodiment, semiconductor die 200D is the uppermost die in a die stack 300, and may be devoid of TSVs 204 as unnecessary if no electrical connections at the top of die stack are desired.

Figure 1F:
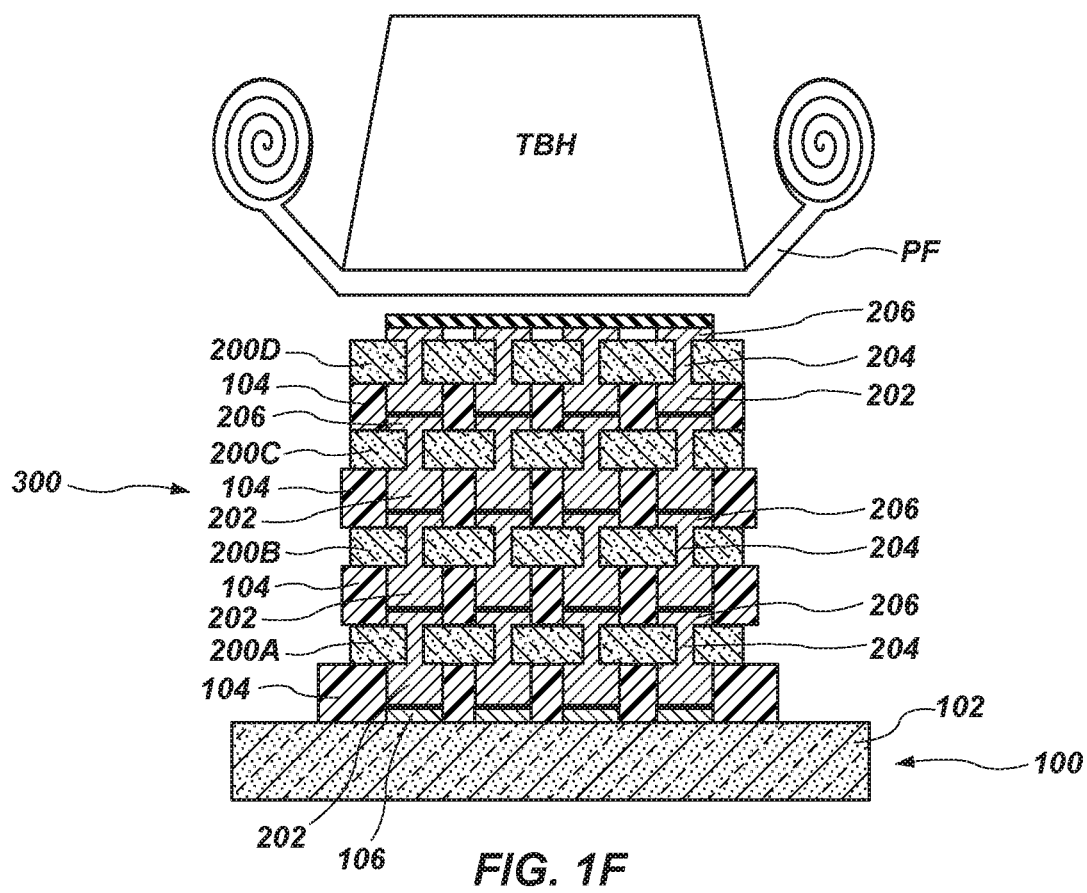
FIG. 1F schematically depicts conventional thermocompression bonding of a stack of semiconductor dice as shown in FIG. 1E, and a resulting semiconductor dice assembly.

FIG. 1F depicts a method of thermocompression bonding conductive elements of the components of FIG. 1E in a gang bonding process. As shown in FIG. 1F, die stack 300 comprising mutually tacked semiconductor dice 200A-200D, with lowermost semiconductor die 200A tacked to semiconductor die location 102 of substrate 100, is subjected to a conventional thermocompression bonding process by application of heat and pressure (i.e., downward vertical force) by thermocompression bond head TBH to diffusion bond conductive elements 202 to conductive elements 206, 106. Thus, with TSVs 204, semiconductor dice 200A-200D and semiconductor die location 102 are electrically and mechanically (i.e., metallurgically) interconnected by the thermocompression bonding process to form a die stack 300. As shown, thermocompression bond head TBH may, optionally, be employed in a film assist gang bond process, wherein a protective high-temperature polymer protective film PF is located between thermocompression bond head TBH and uppermost semiconductor die 200D to prevent tool contamination. While not shown, thermocompression bond head TBH is then moved to each other semiconductor die location 102 on substrate 100 bearing a die stack 300, and the thermocompression bonding repeated, until all die stacks 300 have been bonded. Subsequently, as is conventional, the die stacks 300 on substrate 100 are encapsulated with a dielectric epoxy molding compound using, for example, a transfer molding process. Encapsulation subsequent to diffusion bonding is conventionally employed as a desirable technique for protecting the assembly of the die stack 300 on substrate 100. The encapsulated assembly is inverted and conductive elements, such as solder bumps (not shown) are applied to or formed on under bump metallization (UBM, not shown) on the exposed surface of substrate 100 for connection of the die stacks 300 and semiconductor die locations 102 to higher-level packaging. The assembly is then re-inverted and die stacks 300 singulated in combination with their respective underlying semiconductor die locations 102 to form semiconductor die packages.

Embodiments of the disclosure may be implemented using preliminary assemblies of stacks 300 of semiconductor dice 200A-200D on semiconductor die locations 102 of a substrate 100, fabricated as described above with respect to FIGS. 1A through 1E using tacking. The die stacks 300 are then gang bonded and encapsulated in an integrated molding process, for example a compression molding process. Alternatively, a transfer molding process may be employed to implement an integrated gang bonding and molding process.

Figure 2A:
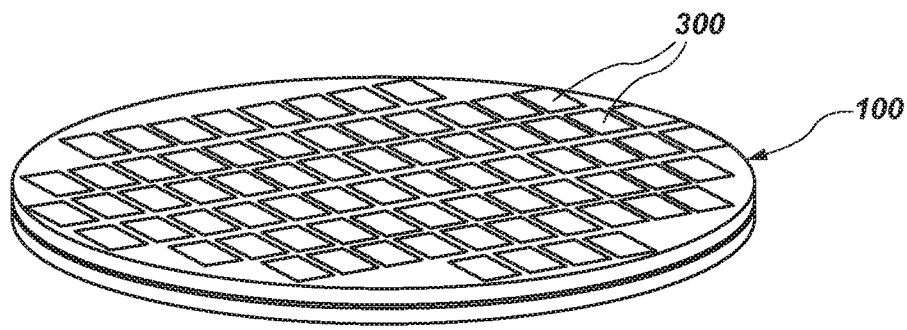
FIG. 2A is a perspective, schematic view of a semiconductor wafer bearing stacks of semiconductor dice initially mechanically and electrically connected and secured over unsingulated die locations of the semiconductor wafer
Figure 2B:
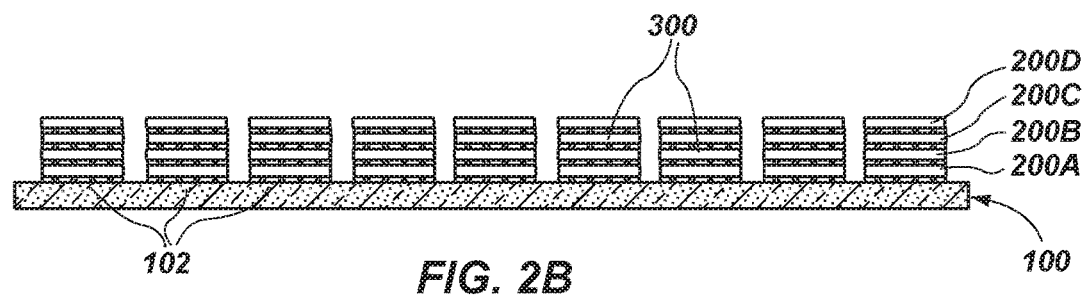
FIG. 2B is a side schematic view of the die stacks secured to the semiconductor wafer.

As shown in FIGS. 2A and 2B, multiple die stacks 300 have been formed on substrate 100, each die stack 300 comprising mutually tacked semiconductor dice 200A-200D, with the lowermost semiconductor die 200A of each die stack 300 tacked to a semiconductor die location 102 of substrate 100. Substrate 100, as employed in implementation of methods of the disclosure, may be a wafer thinned from an initial thickness of, for example, about 600 μm to about 700 μm to a far lesser thickness of, for example, about 30 μm to about 50 μm, although the embodiments of the disclosure are not so limited. The substrate 100 comprises conductive traces and TSVs extending between conductive pads 106 on an upper surface thereof to under bump metallization (UBM) (not shown) bearing conductive elements, such as solder bumps S. Substrate 100, in implementation of embodiments of the method of the disclosure, may be adhered on the side thereof bearing the conductive elements to a carrier wafer by a carrier attach adhesive.

It is noted that, if neither a WLUF or NCF approach is employed, a molded underfill (MUF) process may be employed to fill the bond lines between the substrate 100 and lowermost semiconductor die 200A, and between each level of semiconductor dice 200A-200D (or greater).

Figure 3:
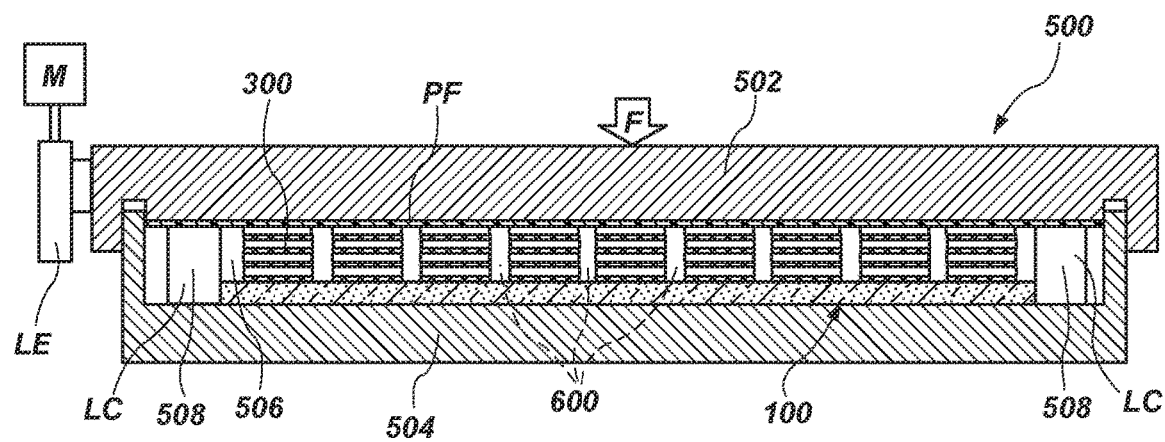
FIG. 3 is a side schematic view of the die stacks and semiconductor wafer of FIGS. 2A and 2B in a compression mold for application of heat and pressure perpendicular to the plane of the semiconductor wafer for gang bonding and simultaneous encapsulation of die stacks carried by the semiconductor wafer.

As shown in FIG. 3, substrate 100 bearing multiple tacked die stacks 300 is placed in a mold 500 of a compression molding apparatus. Mold 500 comprises an upper mold segment 502 and a lower mold segment 504, the upper and lower mold segments 502, 504 cooperatively engaging to form upper, lower and sidewalls of a mold cavity 506. Mold cavity 506 is sized and configured to accommodate the footprint of substrate 100, and upper mold segment 502 is vertically movable with respect to lower mold segment 504 through a limited travel while maintaining sealed peripheral engagement between the two mold segments 502, 504. A commercially available (available from, e.g., Hitachi Chemical Company America; Hexion; Caplinq; Kyocera) epoxy resin-based molding compound 600 as indicated in broken lines of epoxy resin, hardener, filler (e.g., silica) and catalyst (e.g., accelerator) located in mold cavity 506 is heated at a temperature of, for example about 100° C. to about 200° C., to a flowable (e.g., liquid) state and upper mold segment 502 contacts the uppermost semiconductor die 200D of each die stack 300 through a high-temperature polymer protective film PF applied between the lower surface of the upper mold segment 502 and the die stacks 300, concurrently encapsulating die stacks 300 with molding compound 600 and subjecting die stacks 300 to pressure (i.e., compressive force applied perpendicular to the major plane of substrate 100) in a low temperature bonding process to mutually gang bond conductive elements 202 to conductive elements 106, 206 (see FIGS. 1A-1E) in each respective die stack 300. Notably, the gang bonding process according to embodiments of the disclosure may be carried out effectively at temperatures substantially lower than those required for even low temperature thermocompression bonding (i.e., well below 300° C.), and well within the temperature range of about 100° C. to about 200° C. required to liquefy and cure epoxy resin-based molding compounds.

In the mold configuration as described, upper mold segment 502 of mold 500 functions as a bond head to apply downward pressure and simultaneously gang bond conductive elements 202 to conductive elements 206, 106 at the mold temperature utilized for encapsulation. Thus, with TSVs 204, semiconductor dice 200A-200D and semiconductor die locations 102 of all die stacks 300 are electrically and metallurgically interconnected. A mold release may be used to coat the interior walls of mold cavity 506 to prevent adherence of epoxy molding compound. As shown in FIG. 3, two or more stops 508 of a preselected height may be placed between upper mold segment 502 and lower mold segment 504 to set a precise, common height of the various die stacks 300 and resulting semiconductor device packages 400 (FIG. 4) and help control bond line thicknesses (i.e., the vertical space between vertically adjacent semiconductor dice 200A-200D, 102 of each die stack 300). As another approach, a travel control, for example in the form of a linear encoder LE operably coupled to, and for control of, drive motor M used to translate upper mold segment 502, may be employed to limit travel of the upper mold segment 502 by stopping drive motor M to provide a predetermined, uniform package height for all of the die stacks 300. The linear encoder may be adjustable to one or more different travel limits to accommodate different assembly heights. In lieu of linear encoder LE, drive motor M may be configured as a programmable stepper motor for limiting travel. Further, one or more load cells LC may be employed, for example located in mold cavity 506, operably coupled to and for control of drive motor M to limit the force applied by upper mold segment 502 to the die stacks 300. Load cells LC may be adjustable to stop drive motor M at different load (i.e., applied force) limits. Subsequently, the assembly of die stacks 300 encapsulated in cured, solidified molding compound 600 on substrate 100 is singulated through the molding compound and between the semiconductor die locations 102 to form semiconductor device packages 400 after the encapsulated assembly of die stacks 300 on substrate 100 has been debonded from the carrier wafer.

Figure 4:
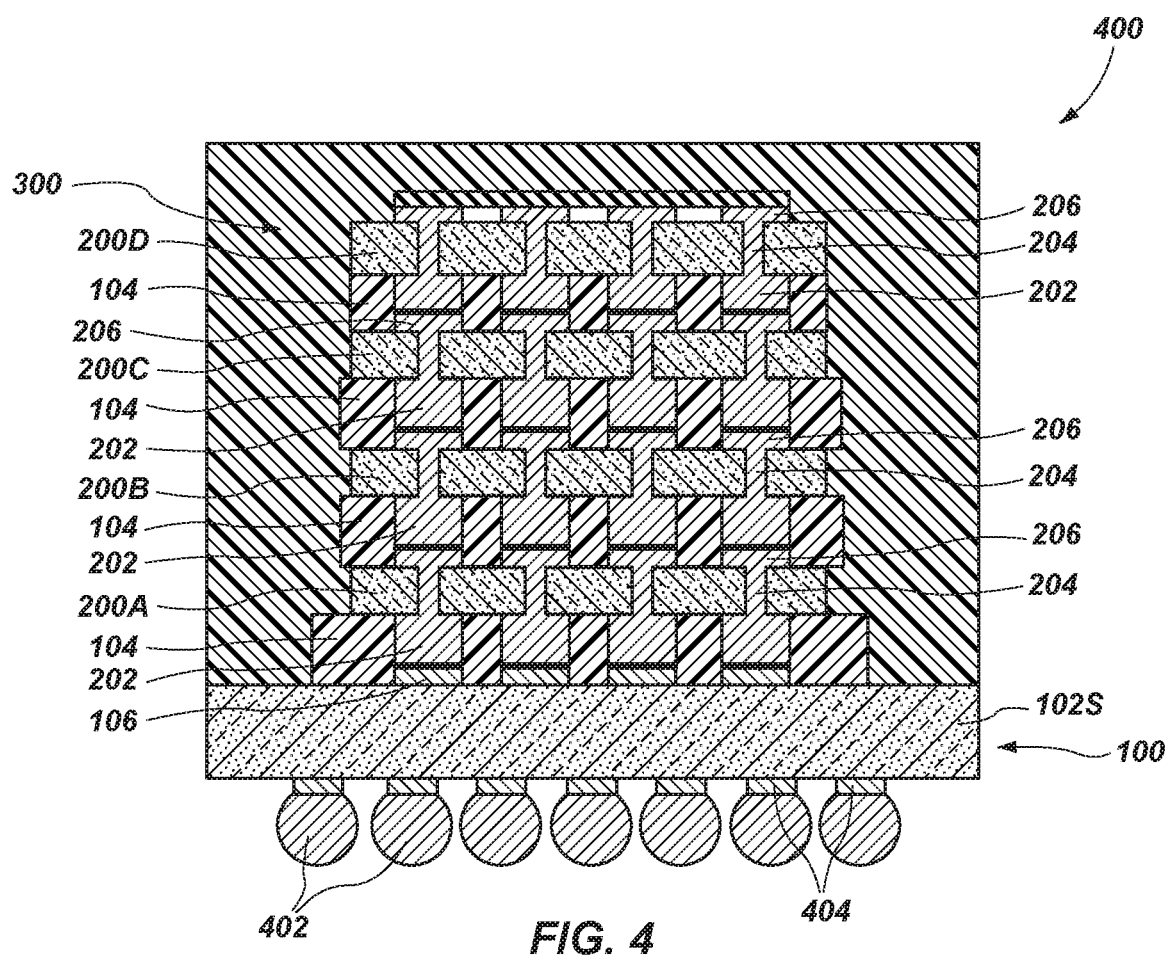
FIG. 4 is a side schematic cross-sectional view of a semiconductor package fabricated in accordance with embodiments of the disclosure.

Semiconductor device package 400 as depicted in FIG. 4 comprises a die stack 300 of semiconductor dice 200-200D mutually gang bonded and lowermost semiconductor die 200A gang bonded to semiconductor die 102s, singulated from substrate 100. Die stack 300 is encapsulated in an epoxy molding compound, which covers the sides of die stack 300 and extends to the upper surface of semiconductor die 102s. The epoxy molding compound may or may not also cover the top of die stack 300, as shown. In some embodiments, the encapsulant material may be ground off the tops of the encapsulated die stacks 300 on substrate 100 prior to singulation. Solder bumps 402 reside on UBM 404.

It should be noted that compression mold 500 may be configured for operation in inverted form as is common in compression molding processes, wherein substrate 100 is inverted and secured to upper mold segment 502, to facilitate liquefaction of epoxy resin molding compound 600 in lower mold segment 504 and promote flow of the liquefied epoxy molding compound 600 between and around die stacks 300 and against substrate 100. However, the compression mold 500 may be operated as depicted, with epoxy resin, hardener, silica and additives introduced around die stacks 300, and pressure applied by mutual converging movement of upper mold segment 502 and lower mold segment 504 as heat is applied to mold 500 using, for example, resistive heating elements in contact with, or embedded in, the upper and lower mold segments 502, 504.

Figure 5:
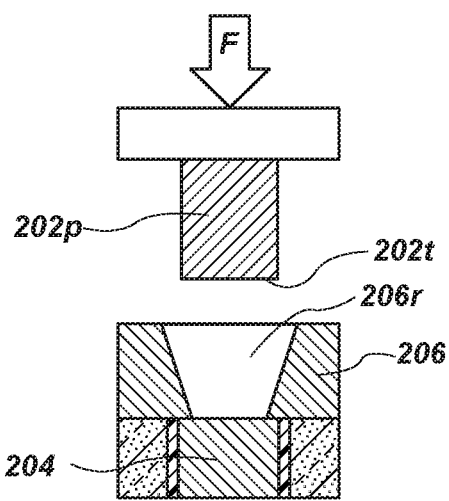
FIG. 5 is an enlarged schematic side view of example conductive element configurations that may be employed in an insertion bonding implementation of embodiments of the disclosure.

By way of further description, the gang bonding process employed in the embodiment above may comprise so-called "insertion bonding," wherein as shown in FIG. 5 conductive elements 202 formed of copper are conventionally shaped as pillars 202p, and conductive pads 206 of copper are formed with frusto-conically-shaped recesses 206r for receipt of tips 202t in an interference fit. As the edges of tips 202t of pillars 202p enter recesses 206r under applied vertical force, the relatively small contact area results in a high shear stress along the pillar/pad interface, allowing for relatively easy plastic deformation of the pillar at the contact area. As the pillars 202p enter the recesses 206r to a greater depth, pillar 202p further deforms. At about 1% plastic deformation or greater, a bond is formed between pillars 202p and pads 206. Such a bond may be achieved at as low as ambient (room) temperature in the presence of a cleaning agent to remove contaminants such as oxides. At a higher temperature, for example 100° C., even greater plastic deformation of the mating pillars 202p and pads 206 and thus a more robust and substantially seamless bond is formed due to the lower yield stress resulting from the higher temperature. Thus, it is apparent that insertion bonding for use as a gang bonding process integrated with encapsulation may be implemented.

Figure 6:
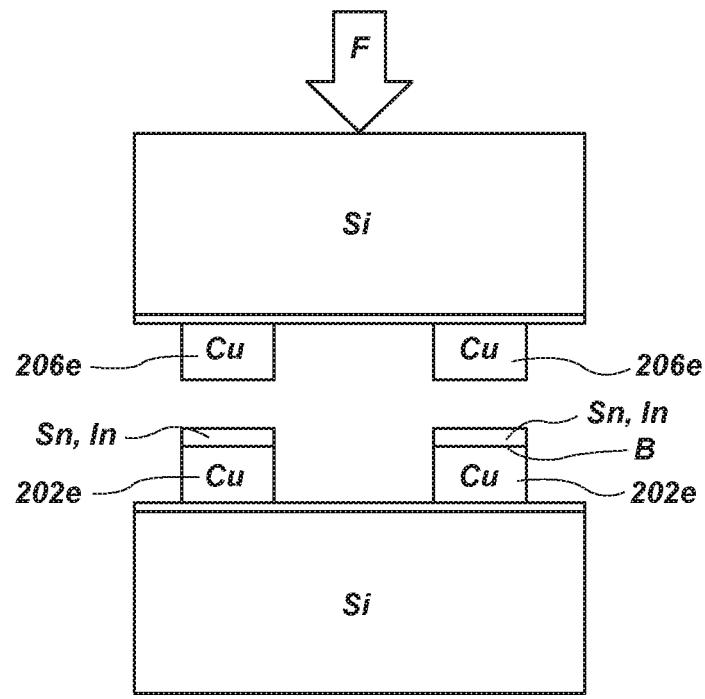
FIG. 6 is an enlarged schematic side view of example conductive element configurations that may be employed in a eutectic bonding implementation of embodiments of the disclosure.

Instead of insertion bonding, low temperature eutectic bonding may be employed in the embodiment above. Configurations of conductive elements 202e and 206e are depicted in FIG. 6. In FIG. 6, conductive element 202e comprises a Cu pillar topped by a cap of Sn and/or In. Pad 206e comprises Cu. A thin buffer layer B, for example 3 μm of Ni, may reside between the cap of Sn and/or In and the Cu of pillar 202p to prevent too rapid diffusion of the cap material into the pillar material. In some instances, for thinner bond lines, the Cu pillar is eliminated, leaving just the Ni material, which may be plated with Au to allow for better wetting of the Sn or In. Eutectic bonding using the materials described above and as depicted may take place at temperatures as low as about 150° C. under a relatively low applied force F to facilitate contact of aligned conductive elements, particularly if a slow temperature ramp up is employed to reduce excess flow of the cap material. It is also contemplated that pads 206e may also be capped with Sn and/or In, and a buffer layer employed between the copper of the pad 206e and the pad material. Thus, eutectic bonding may be effected as a gang bonding process integrated with encapsulation as described above.

Figure 7:
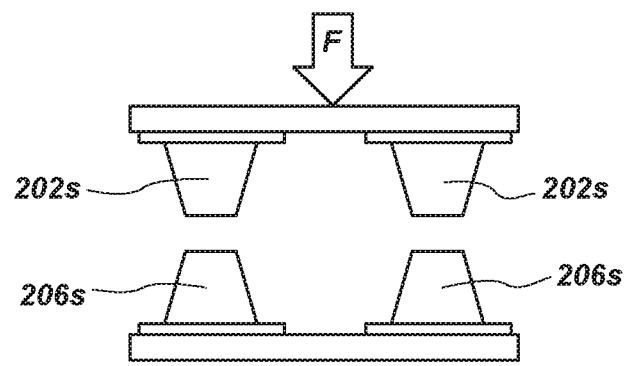
FIG. 7 is an enlarged schematic side view of an example conductive element configuration that may be employed with a low temperature solder bonding implementation of embodiments of the disclosure.

Further, low temperature solders may be employed in the embodiment above. For example, indium bumps may be employed with, for example, a NCF (not shown) between the die stack components, indium having a melting temperature of 156.6° C., well within the range of acceptable cure temperatures of many epoxy molding compounds. A nominal force F may be applied to facilitate contact of aligned conductive elements and compensate for normal height tolerances. Example configurations of conductive elements 202s and 206s are depicted in FIG. 7. Thus, low temperature solder bonding may be effected as a gang bonding process integrated with encapsulation as described above.

Figure 8:
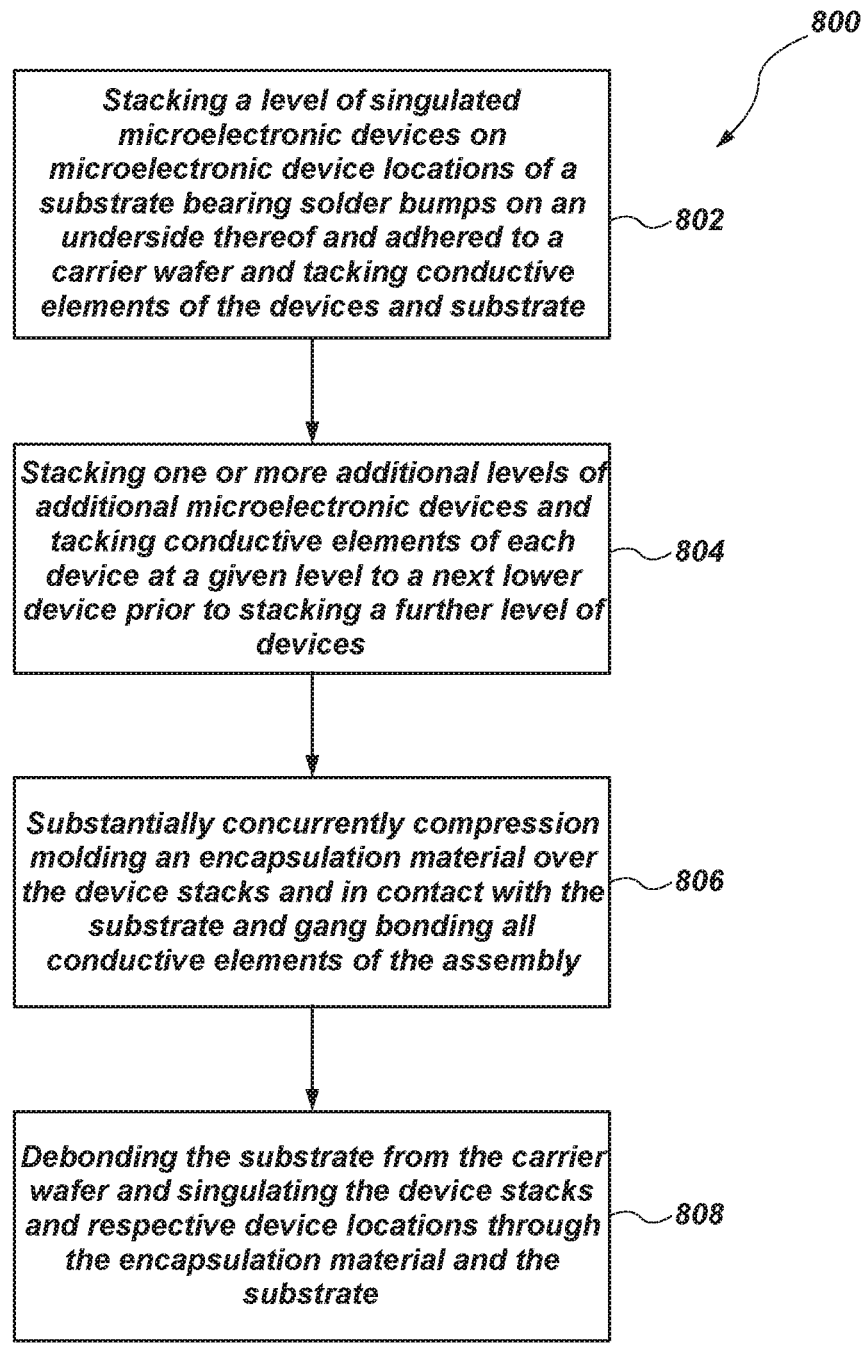
FIG. 8 is a flow diagram of acts comprising a method according to an embodiment of the disclosure.

FIG. 8 is a flow diagram of acts comprising a method 800 according to an embodiment of the disclosure. In method 800, act 802 comprises stacking a level of singulated microelectronic devices on respective microelectronic device locations of a substrate bearing solder bumps on an underside thereof and adhered to a carrier wafer, followed by tacking conductive elements of the devices and substrate. Act 804 comprises stacking one or more levels of additional microelectronic devices and tacking conductive elements of each device at a given level to a next lower device prior to stacking a further level of devices. Act 806 comprises substantially concurrently compression molding an encapsulation material over the device stacks and in contact with the substrate, and gang bonding all conductive elements of the assembly. Act 808 comprises debonding the substrate from the carrier wafer, and singulating the device stacks and respective device locations through the encapsulation material and the substrate.

Figure 9:
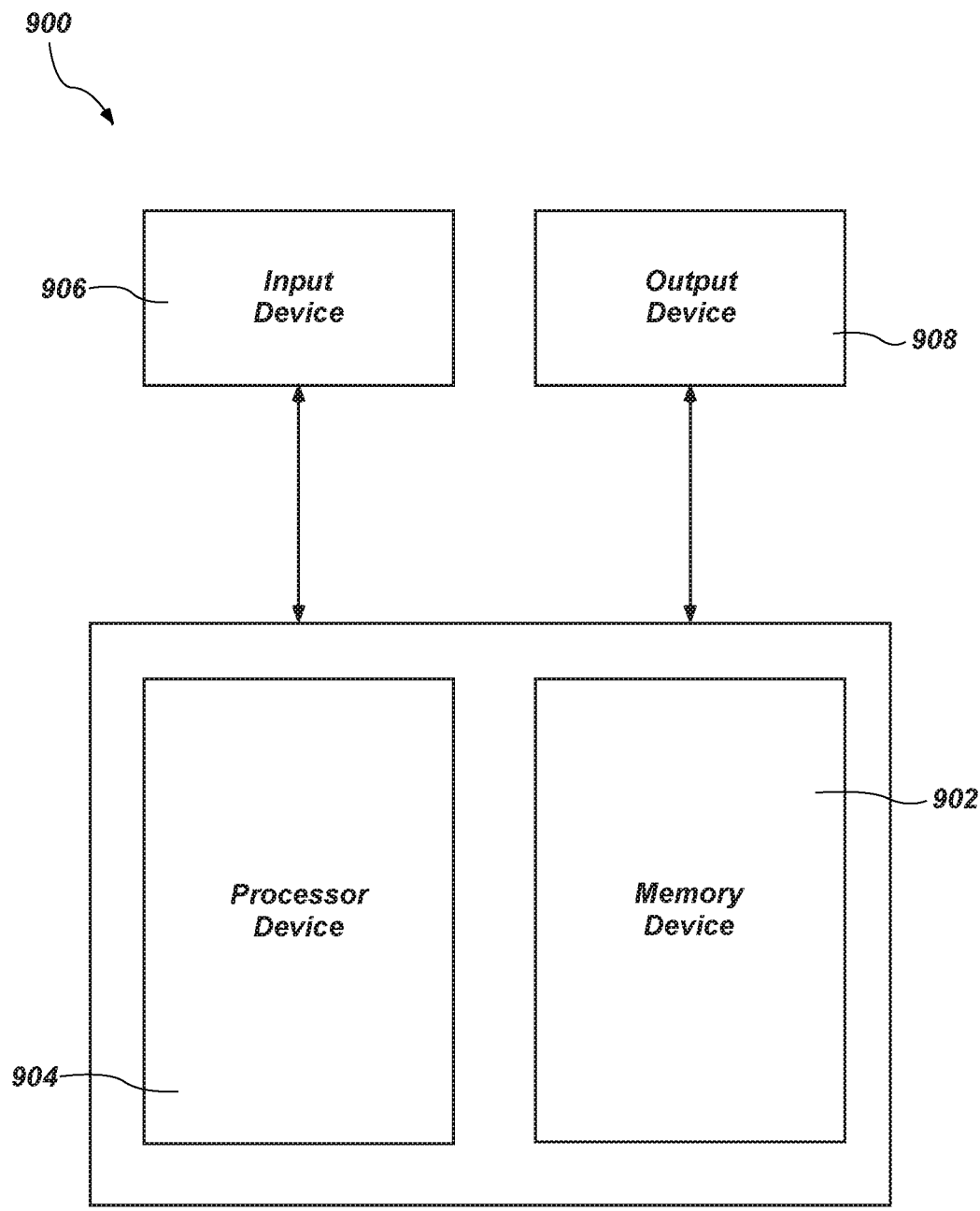
FIG. 9 is a schematic of an electronic system employing at least one microelectronic device package in accordance with the disclosure.

The microelectronic devices according to embodiments of the disclosure may be used in embodiments of electronic systems of the disclosure. For example, FIG. 9 is a block diagram of an illustrative electronic system 900 according to embodiments of disclosure. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 900 includes at least one electronic device fabricated in accordance with embodiments of the disclosure. The electronic device may comprise, for example, a memory device 902 comprising an embodiment of one or more of the microelectronic or semiconductor device packages 400 previously described herein, such as a DDR4 DRAM device. The electronic system 900 may further include at least one processor device 904 (often referred to as a "microprocessor"). The electronic system 900 may further include one or more input devices 906 for inputting information into the electronic system 900 by a user, such as, for example, a mouse or other pointing device, a keyboard, a touchpad, a button, or a control panel. The electronic system 900 may further include one or more output devices 908 for outputting information (e.g., visual or audio output) to a user such as, for example, a monitor, a display, a printer, an audio output jack, a speaker, etc. In some embodiments, the input device 906 and the output device 908 may comprise a single touchscreen device that can be used both to input information to the electronic system 900 and to output visual information to a user. The input device 906 and the output device 908 may communicate electrically with one or both of the processor device 904 and the memory device 902.

In some embodiments, a method of fabricating a microelectronic device assembly comprises disposing at least one stack of microelectronic devices supported on a substrate in a molding apparatus and substantially concurrently at least partially encapsulating the at least one stack of microelectronic devices and bonding mutually aligned conductive elements of the at least one stack of microelectronic devices within the molding apparatus.

In some embodiments, a method of fabricating semiconductor device packages comprises stacking a level of singulated semiconductor dice on spaced die locations of a substrate and tacking conductive elements of the singulated semiconductor dice to aligned conductive elements of the die locations of the substrate. At least another level of singulated semiconductor dice is stacked on semiconductor dice of the level of semiconductor dice and tacking conductive elements of the semiconductor dice of the at least another level to aligned conductive elements of the semiconductor dice of the level. The substrate and stacked singulated semiconductor dice are disposed into a lower mold segment of a compression molding apparatus, and a dielectric encapsulant is introduced into the lower mold segment. An upper mold segment of the molding apparatus is placed over the lower mold segment. The compression molding apparatus is heated while applying force with at least one of the upper and lower mold segments to the singulated semiconductor dice and the substrate perpendicular to a major plane of the substrate to gang bond aligned conductive elements of the singulated semiconductor dice and of the substrate and substantially concurrently form and solidify the dielectric encapsulant around and between the singulated semiconductor dice and over the substrate.

In some embodiments, a method of fabricating microelectronic assemblies comprises providing mutually spaced stacks of microelectronic devices on a substrate and substantially concurrently encapsulating the stacks of microelectronic devices on the substrate and gang bonding mutually aligned conductive elements of vertically adjacent microelectronic devices.

In some embodiments, a microelectronic device assembly fabrication method comprises assembling at least two microelectronic devices with mutually aligned and contacting conductive elements and substantially concurrently bonding the mutually aligned and contacting conductive elements and at least partially encapsulating the assembled at least two microelectronic devices.

In some embodiments, a compression molding apparatus comprises an upper mold segment and a lower mold segment sized and configured to define, in combination with the upper mold segment, a mold cavity for receiving microelectronic device assemblies. One of the upper mold segment and the lower mold segment is configured for movement toward and away from the other mold segment. A drive is operably coupled to the one of the upper mold segment and the lower mold segment configured for movement, and apparatus is included for limiting at least one of travel of the one of the upper mold segment and the lower mold segment configured for movement toward the other mold segment, and force applied by the one of the upper mold segment and the lower mold segment configured for movement to microelectronic device assemblies in the mold cavity.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of fabricating a microelectronic device assembly, comprising:
   disposing at least one stack of microelectronic devices supported on a substrate in a molding apparatus; and
   substantially concurrently at least partially encapsulating the at least one stack of microelectronic devices and bonding mutually aligned conductive elements of the at least one stack of microelectronic devices within the molding apparatus.

2. The method of claim 1, wherein bonding comprises one of insertion bonding, eutectic bonding or low temperature solder bonding.

3. The method of claim 1, wherein the encapsulating and bonding is effected while subjecting the substrate and at least one stack of microelectronic devices to a temperature within a range of about 130° C. to about 185° C.

4. The method of claim 1, wherein the at least one stack of microelectronic devices comprises a number of mutually laterally spaced die stacks, each die stack located on an unsingulated die location of the substrate, the method further comprising bonding conductive elements of each die location to aligned conductive elements of a lowermost die of a die stack located thereon.

5. The method of claim 4, further comprising, after at least partially encapsulating the number of mutually laterally spaced die stacks, singulating the at least partially encapsulated mutually laterals spaced die stacks through a dielectric encapsulant between the die stacks and through the substrate.

6. The method of claim 1, further comprising substantially concurrently applying vertical force to the at least one stack of microelectronic devices with at least one mold segment of the molding apparatus and heat to the at least one stack of microelectronic devices with a heated dielectric encapsulant within the molding apparatus.

7. The method of claim 6, wherein the molding apparatus comprises a compression molding apparatus, and further comprising heating the heated dielectric encapsulant to a flowable state while substantially concurrently applying the vertical force to the at least one stack of microelectronic devices with the at least one mold segment.

8. The method of claim 6, further comprising placing stops between upper and lower mold segments of the molding apparatus to limit mutual vertical travel between the upper mold segment and the lower mold segment before substantially concurrently at least partially encapsulating the at least one stack of microelectronic devices and bonding mutually aligned conductive elements of the at least one stack of microelectronic devices within the molding apparatus.

9. The method of claim 1, further comprising, before disposing the at least one stack of microelectronic devices supported on a substrate in the molding apparatus, tacking mutually aligned conductive elements of the at least one stack of microelectronic devices.

10. The method of claim 9, wherein tacking comprises concurrent application of heat and vertical force to the at least one stack of microelectronic devices.

11. The method of claim 9, further comprising tacking conductive elements of the substrate to aligned conductive elements of a lowermost microelectronic device of the at least one stack of microelectronic devices.

12. The method of claim 11, wherein the at least one stack of microelectronic devices comprises a number of mutually spaced stacks of microelectronic devices, the method further comprising tacking conductive elements of each level of microelectronic devices of the number of mutually spaced stacks of microelectronic devices to aligned conductive elements of the substrate or of a next lower level before adding a further level of microelectronic devices to the number of mutually spaced stacks of microelectronic devices.

13. The method of claim 12, wherein bonding comprises substantially concurrent gang bonding of mutually aligned conductive elements of the microelectronic devices of the number of mutually spaced stacks of microelectronic devices and of the substrate.

14. The method of claim 13, wherein gang bonding comprises one of insertion bonding, eutectic bonding and low temperature solder bonding.

15. A method of fabricating semiconductor device packages, comprising:
   stacking a level of singulated semiconductor dice on spaced die locations of a substrate and tacking conductive elements of the level of singulated semiconductor dice to aligned conductive elements of the spaced die locations of the substrate;
   stacking at least another level of singulated semiconductor dice on semiconductor dice of the level of singulated semiconductor dice and tacking conductive elements of the singulated semiconductor dice of the at least another level to aligned conductive elements of the singulated semiconductor dice of the level;
   disposing the substrate and stacked singulated semiconductor dice into a lower mold segment of a compression molding apparatus;
   introducing a dielectric encapsulant into the lower mold segment;
   placing an upper mold segment of the compression molding apparatus over the lower mold segment; and
   heating the compression molding apparatus while applying force with at least one of the upper and lower mold segments to the singulated semiconductor dice and the substrate perpendicular to a major plane of the substrate to gang bond aligned conductive elements of the singulated semiconductor dice and of the substrate and substantially concurrently form and solidify the dielectric encapsulant around and between the singulated semiconductor dice and over the substrate.

16. The method of claim 15, further comprising tacking conductive elements of each singulated semiconductor die to aligned conductive elements of a die location or a semiconductor die of a lower level before stacking another singulated semiconductor die.

17. The method of claim 16, wherein tacking comprises application of heat and vertical force.

18. The method of claim 15, further comprising, before placing the upper mold segment over the lower mold segment, placing two or more stops in the lower mold segment, the stops of a height approximating a desired height of semiconductor device packages comprising the substrate, the level of singulated semiconductor dice and the at least another level of singulated semiconductor dice.

19. The method of claim 15, wherein gang bonding comprises insertion bonding, eutectic bonding or low temperature solder bonding.

20. The method of claim 15, further comprising:
removing the substrate, singulated semiconductor dice and solidified dielectric encapsulant from the compression molding apparatus;
optionally grinding encapsulation from over tops of semiconductor dice of an uppermost level; and
singulating semiconductor device packages through the solidified dielectric encapsulant and the substrate between the singulated semiconductor dice.

21. The method of claim 15, effected at a mold cavity temperature of about 130° C. to about 185° C.

22. A method of fabricating microelectronic device assemblies, comprising:
providing mutually spaced stacks of microelectronic devices on a substrate; and
substantially concurrently encapsulating the mutually spaced stacks of microelectronic devices on the substrate and gang bonding mutually aligned conductive elements of vertically adjacent microelectronic devices.

23. The method of claim 22, further comprising gang bonding conductive elements of the substrate to mutually aligned conductive elements of lowermost microelectronic devices in each of the mutually spaced stacks of microelectronic devices.

24. The method of claim 22, wherein gang bonding comprises insertion bonding, eutectic bonding or low temperature solder bonding, and encapsulating comprises encapsulating with an epoxy resin molding compound.

25. The method of claim 22, wherein the substantially concurrently encapsulating the mutually spaced stacks of microelectronic devices on the substrate and gang bonding mutually aligned conductive elements of vertically adjacent microelectronic devices is effected by compression molding.

26. A microelectronic device assembly fabrication method, comprising:
assembling at least two microelectronic devices with mutually aligned and contacting conductive elements; and
substantially concurrently bonding the mutually aligned and contacting conductive elements and at least partially encapsulating the assembled at least two microelectronic devices.

27. A compression molding apparatus, comprising:
an upper mold segment;
a lower mold segment sized and configured to define, in combination with the upper mold segment, a mold cavity for receiving microelectronic device assemblies;
wherein one of the upper mold segment and the lower mold segment is configured for movement toward and away from the other mold segment;
a drive operably coupled to the one of the upper mold segment and the lower mold segment configured for movement; and
apparatus for limiting at least one of travel of the one of the upper mold segment and the lower mold segment configured for movement toward the other mold segment, and force applied by the one of the upper mold segment and the lower mold segment configured for movement to microelectronic device assemblies in the mold cavity.

28. The compression molding apparatus of claim 27, wherein the apparatus for
limiting travel of the one of the upper mold segment and the lower mold segment configured for movement toward the other mold segment comprises at least one of multiple stops of a preselected height located in the cavity between the upper and lower mold segments, a linear encoder operably coupled to the drive and adjustable to stop the drive at one or more selected travel limits, and the drive configured as a stepper motor.

29. The compression molding apparatus of claim 27, wherein the apparatus for
limiting force applied by the one of the upper mold segment and the lower mold segment configured for movement to microelectronic device assemblies in the cavity comprises one or more load cells located in the mold cavity, operably coupled to the drive and adjustable to stop the drive at one or more selected applied forces.

* * * * *